United States Patent
Kittock et al.

(10) Patent No.: US 11,563,447 B2
(45) Date of Patent: Jan. 24, 2023

(54) SCATTERPLOT DATA COMPRESSION

(71) Applicant: International Business Machines Corporation, Armonk, NY (US)

(72) Inventors: Louis Lawrence Kittock, Chicago, IL (US); David Paul Nichols, Evanston, IL (US); Todd Michael Peterson, Naperville, IL (US); Donald Peter Pierucci, Chicago, IL (US); Jane Chunxiang Jiang, South Barrington, IL (US)

(73) Assignee: International Business Machines Corporation, Armonk, NY (US)

( * ) Notice: Subject to any disclaimer, the term of this patent is extended or adjusted under 35 U.S.C. 154(b) by 494 days.

(21) Appl. No.: 16/671,331

(22) Filed: Nov. 1, 2019

(65) Prior Publication Data
US 2021/0135686 A1  May 6, 2021

(51) Int. Cl.
*G06F 16/25* (2019.01)
*H03M 7/30* (2006.01)

(52) U.S. Cl.
CPC ............ *H03M 7/70* (2013.01); *G06F 16/258* (2019.01)

(58) Field of Classification Search
CPC .... H03M 7/3059; H03M 7/6064; H03M 7/70; G06F 16/258
See application file for complete search history.

(56) References Cited

U.S. PATENT DOCUMENTS

| 9,298,789 | B2 | 3/2016 | Hao et al. |
| 9,342,579 | B2* | 5/2016 | Cao ..................... G06F 16/287 |
| 9,679,401 | B2 | 6/2017 | Hao et al. |
| 9,880,086 | B2 | 1/2018 | Hao et al. |
| 10,025,813 | B1* | 7/2018 | Gebremariam ........... G06F 7/02 |
| 2007/0147685 | A1 | 6/2007 | Ericson |
| 2011/0242106 | A1* | 10/2011 | Hao ..................... G06T 11/206 |
| | | | 715/764 |
| 2014/0095425 | A1* | 4/2014 | Sipple ..................... G06N 5/02 |
| | | | 706/52 |
| 2015/0046862 | A1 | 2/2015 | Hansen |

(Continued)

OTHER PUBLICATIONS

Callaway et al., Compression Algorithm for Display Data Using Character-Encoding Tables, An IP.com Prior Art Database Technical Disclosure, pp. 1-2. (Year: 1989).*

(Continued)

*Primary Examiner* — Cheyne D Ly
(74) *Attorney, Agent, or Firm* — Robert J. Shatto

(57) ABSTRACT

Provided is a method for encoding scatterplot data using strings. The method may comprise receiving a plurality of data points in a data set. Each data point has at least a first data value corresponding to a first dimension and a second data value corresponding to a second dimension. The method further comprises determining a first resolution for the first dimension and a second resolution for the second dimension. The method further comprises determining an encoding scheme for encoding the plurality of data points. The encoding scheme includes a plurality of valid encoding characters. The method further comprises encoding each of the plurality of data points based on the first resolution, the second resolution, and the encoding scheme.

11 Claims, 9 Drawing Sheets

(56) References Cited

U.S. PATENT DOCUMENTS

2015/0142837 A1* 5/2015 Lopez ............... H04N 19/33
    707/756
2016/0284108 A1  9/2016 Wang et al.

OTHER PUBLICATIONS

Hao et al., "Variable binned scatter plots," Information Visualization; 9 (2010) 3.—S. 1994-203, http://dx.doi.org/10.1057/ivs.2010.4, 10 pgs.

Mell et al., "The NIST Definition of Cloud Computing," Recommendations of the National Institute of Standards and Technology, U.S. Department of Commerce, Special Publication 800-145, Sep. 2011, 7 pgs.

\* cited by examiner

SCATTERPLOT DATA COMPRESSION

BACKGROUND

The present disclosure relates generally to the field of computing, and more particularly to compression of scatterplot data.

In signal processing, data compression, source coding, or bit-rate reduction involves encoding information using fewer bits than the original representation. Compression can be either lossy or lossless. Lossless compression reduces bits by identifying and eliminating statistical redundancy. No information is lost in lossless compression. Lossy compression reduces bits by removing unnecessary or less important information. The process of reducing the size of a data file is often referred to as data compression

SUMMARY

Embodiments of the present disclosure include a method, computer program product, and system for encoding scatterplot data using strings. The method may comprise receiving a plurality of data points in a data set. Each data point has at least a first data value corresponding to a first dimension and a second data value corresponding to a second dimension. The method further comprises determining a first resolution for the first dimension and a second resolution for the second dimension. The method further comprises determining an encoding scheme for encoding the plurality of data points. The encoding scheme includes a plurality of valid encoding characters. The method further comprises encoding each of the plurality of data points based on the first resolution, the second resolution, and the encoding scheme.

The above summary is not intended to describe each illustrated embodiment or every implementation of the present disclosure.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of typical embodiments and do not limit the disclosure.

Figure 1:
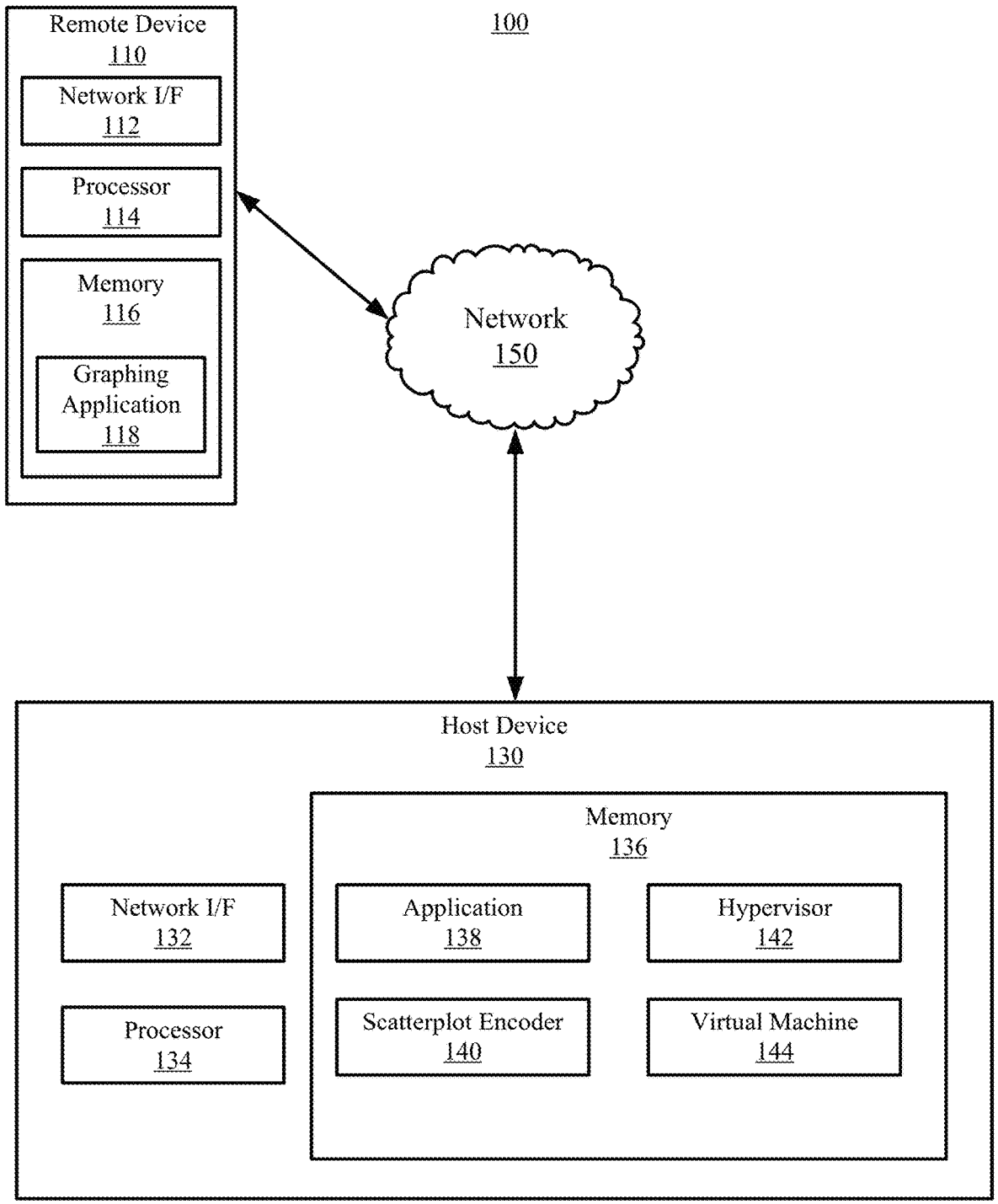
FIG. 1 illustrates a block diagram of an example computing environment in which illustrative embodiments of the present disclosure may be implemented.

While the embodiments described herein are amenable to various modifications and alternative forms, specifics thereof have been shown by way of example in the drawings and will be described in detail. It should be understood, however, that the particular embodiments described are not to be taken in a limiting sense. On the contrary, the intention is to cover all modifications, equivalents, and alternatives falling within the spirit and scope of the invention.

DETAILED DESCRIPTION

Aspects of the present disclosure relate generally to the field of computing, and in particular to compressing scatterplot data. While the present disclosure is not necessarily limited to such applications, various aspects of the disclosure may be appreciated through a discussion of various examples using this context.

Many modern chart creation software packages require that the chart data is in text form, often JavaScript Object Notation (JSON) or extensible markup language (XML). Numbers presented in text form can require many bytes to be transmitted and stored. In JSON for example, the largest supported number can occupy 128 bytes. Even with numbers that occupy only a few characters, when presented with large datasets common to scatterplots, the amount of memory required to present the data can cause serious performance problems. Additionally, transmitting the underlying scatterplot data can require a significant amount of network bandwidth.

Disclosed herein are a method, system, and computer program product for compressing this textual data to save memory and processing time, while keeping the look of the final chart identical to the uncompressed chart. In some embodiments, a plurality of data pairs (x, y) may be received. The plurality of data pairs represent a set of first values (e.g., of a first variable x) and a set of second values (e.g., of a second variable y). A minimum and maximum value for the first and second variables may be determined. Using the minimum and maximum values, a range for the first variable and a range for the second variable may be calculated. A minimum resolution for the first and second variables may be received (e.g., from a user). The minimum resolution may establish the number of distinct points (e.g., bins) that will be represented on each axis. The encoding scheme to be used may be determined. The number of grids may be determined by dividing the resolution by the number of one-byte characters supported by the encoding scheme. The bin width may also be determined. Each of the data pairs (x, y) may be encoded according to a predetermined resolution mapping utilizing differences and character encoding based on the resolution for x and the resolution for y. In some embodiments, the JSON file (or other file format) is automatically generated by the processor.

In some embodiments, the user specifies a desired resolution of the chart's data frame in both the x and y dimensions. This resolution specifies how many possible points there are. Often, this value will be a pixel count, but the resolution could be higher to enable zooming of the final image without artifacts, for example.

The chart's data frame will be partitioned into a grid. The desired resolution and encoding scheme govern how many of these grids exist. For example, the higher the resolution, the more grids that may be required. Similarly, encoding schemes that have more usable one-byte characters with which to encode the data require fewer grids than encoding schemes with fewer usable one-byte characters.

Each grid will be further partitioned into bins. Each bin can be indexed by a single (one-byte) character in each dimension. The number of bins per grid may depend on the encoding scheme used. For example, if the scatterplot data is encoded in JSON, which has 93 usable one-byte characters, each grid may contain 93 bins per dimension. The entire grid will be represented by a string of point pairs, with no separation between points.

In some embodiments, various aesthetics for the scatterplot may also be encoded. Aesthetics are modifiers to the looks of a point. For example, an aesthetic can change the size or color of a point. Aesthetics can also be added using this algorithm, requiring additional character(s) for the aesthetics for each point.

Embodiments of the present disclosure are described using a two-dimensional scatterplot, but the same algorithm could be applied to any number of dimensions, including a one-dimensional point plot, a three-dimensional scatterplot, and others. Additionally, embodiments of the present disclosure are described using JSON and XML file formats. However, this is for illustrative purposes only, and embodiments of the present disclosure may be directed to other formats. Similarly, embodiments described herein utilize American Standard Code for Information Interchange (ASCII) character encoding for illustrative purposes; however, any character encoding that is not otherwise inconsistent with this disclosure is contemplated.

For chart data that requires a large number of characters to represent (e.g., because the numbers are large or they have a high precision), embodiments of the present disclosure can reduce the number of characters required to represent the data for the chart. This can reduce the storage needed to store the data, the processing time needed to parse the data, and the transmission time to send the data if it is being sent to another server.

It is to be understood that the aforementioned advantages are example advantages and should not be construed as limiting. Embodiments of the present disclosure can contain all, some, or none of the aforementioned advantages while remaining within the spirit and scope of the present disclosure.

Turning now to the figures, FIG. 1 illustrates a block diagram of an example computing environment 100 in which illustrative embodiments of the present disclosure may be implemented. In some embodiments, the computing environment 100 may include a remote device 110 and a host device 130.

Consistent with various embodiments, the host device 130 and the remote device 110 may be computer systems. For example, in some embodiments the remote device 110 is a smart phone or desktop computer, and the host device 130 is a server that hosts a hypervisor 142 and virtual machine 144 with a guest operating system. The remote device 110 and the host device 130 may include one or more processors 114 and 134 and one or more memories 116 and 136, respectively.

The remote device 110 and the host device 130 may be configured to communicate with each other through an internal or external network interface 112 and 132. The network interfaces 112 and 132 may be, e.g., modems or network interface cards. For example, the network interfaces 112 and 132 may enable the host device 130 and the remote device 110 to communicate with each other using, such as via network 150.

The remote device 110 and/or the host device 130 may be equipped with a display or monitor. Additionally, the remote device 110 and/or the host device 130 may include optional input devices (e.g., a keyboard, mouse, scanner, or other input device), and/or any commercially available or custom software (e.g., browser software, communications software, server software, natural language processing software, search engine and/or web crawling software, filter modules for filtering content based upon predefined parameters, etc.). In some embodiments, the remote device 110 and/or the host device 130 may be servers, desktop computers, laptop computers, or hand-held devices (e.g., smartphones or tablets).

The remote device 110 and the host device 130 may be distant from each other and communicate over a network 150. In some embodiments, the host device 130 may be a central hub from which remote device 110 can establish a communication connection, such as in a client-server networking model. Alternatively, the host device 120 and remote device 110 may be configured in any other suitable networking relationship (e.g., in a peer-to-peer configuration or using any other network topology).

In some embodiments, the network 150 can be implemented using any number of any suitable communications media. For example, the network 150 may be a wide area network (WAN), a local area network (LAN), an internet, or an intranet. In certain embodiments, the remote device 110 and the host device 130 may be local to each other and communicate via any appropriate local communication medium. For example, the remote device 110 and the host device 130 may communicate using a local area network (LAN), one or more hardwire connections, a wireless link or router, or an intranet. In some embodiments, the remote device 110 and the host device 130 may be communicatively coupled using a combination of one or more networks and/or one or more local connections. For example, the remote device 110 may be hardwired to the host device 130 (e.g., connected with an Ethernet cable) while the second remote device (not shown) may communicate with the host device using the network 150 (e.g., over the Internet).

In some embodiments, the network 150 may be a telecommunication network. The telecommunication network may include one or more cellular communication towers, which may be a fixed-location transceiver that wirelessly communicates directly with a mobile communication terminal (e.g., remote device 110). Furthermore, the network may include one or more wireless communication links to enable transmissions between the remote device 110 and the host device 130. The wireless communications links may include, for example, shortwave, high frequency, ultra-high frequency, microwave, wireless fidelity (Wi-Fi), Bluetooth technology, global system for mobile communications (GSM), code division multiple access (CDMA), second-generation (2G), third-generation (3G), fourth-generation (4G), 4G long-term evolution (LTE), fifth-generation (5G), or any other wireless communication technology or standard to establish a wireless communications link.

In some embodiments, the network 150 can be implemented within a cloud computing environment, or using one or more cloud computing services. Consistent with various embodiments, a cloud computing environment may include a network-based, distributed data processing system that provides one or more cloud computing services. Further, a cloud computing environment may include many computers (e.g., hundreds or thousands of computers or more) disposed within one or more data centers and configured to share resources over the network 150.

In some embodiments, the remote device 110 may receive scatterplot data from the host device 130. For example, the host device 130 may be configured to process data and generate, based on the processing, scatterplot data. The host device 130 may be further configured to compress/encode the scatterplot data using a scatterplot encoder 140. The scatterplot encoder 140 may be software, hardware, firmware, or a combination thereof. The scatterplot encoder 140 may be configured to perform the encoding method described herein (e.g., method 200 of FIG. 2 and/or 300 of FIG. 3) to compress and encode the scatterplot data. The host device 130 may then send the compressed/encoded scatterplot data to the remote device 110 using the network 150. The remote device 110 may then generate and display a scatterplot using the graphing application 118.

In some embodiments, the host device 130 may include a hypervisor 142, a virtual machine 144, an application 138. The hypervisor 142 may host the virtual machine 144. The virtual machine 144 may include a guest operating system, and may execute the scatterplot encoder 140. In other embodiments, the operating system may be installed directly on the host device 130, and the host device 130 may not include a hypervisor or a virtual machine.

While FIG. 1 illustrates a computing environment 100 with a single host device 130 and a single remote device 110, suitable computing environments for implementing embodiments of this disclosure may include any number of remote devices and host devices. The various models, modules, systems, and components illustrated in FIG. 1 may exist, if at all, across a plurality of host devices and remote devices. For example, some embodiments may include two host devices. The two host devices may be communicatively coupled using any suitable communications connection (e.g., using a WAN, a LAN, a wired connection, an intranet, or the Internet).

It is noted that FIG. 1 is intended to depict the representative major components of an exemplary computing environment 100. In some embodiments, however, individual components may have greater or lesser complexity than as represented in FIG. 1, components other than or in addition to those shown in FIG. 1 may be present, and the number, type, and configuration of such components may vary.

Figure 2:
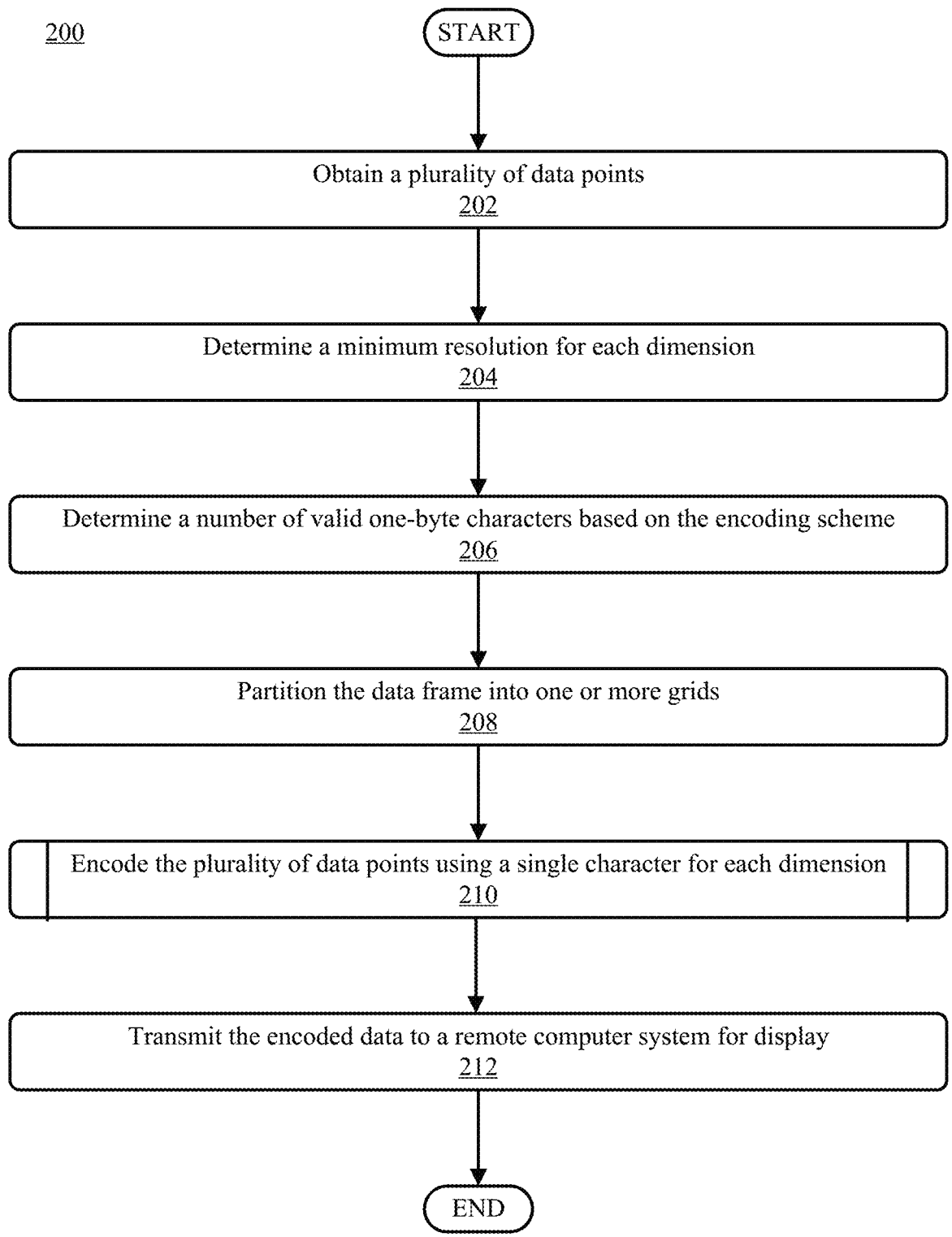
FIG. 2 illustrates a flowchart of an example method for compressing scatterplot data, in accordance with embodiments of the present disclosure.

Referring now to FIG. 2, illustrated is a flowchart of an example method 200 for compressing scatterplot data, in accordance with embodiments of the present disclosure. The method 200 may be performed by hardware, firmware, software executing on a processor, or any combination thereof. For example, the method 200 may be performed by processor 134 of FIG. 1. The method 200 may begin at operation 202, wherein a processor obtains a plurality of data points.

As discussed herein, the plurality of data points may correspond to a scatterplot or other graph. Each data point may have one or more data values that correspond to one or more dimensions. For example, data points for a two-dimensional scatterplot may have two data values: one for the x-dimension and one for the y-dimension. Similarly, data points for a 1-D graph may have a single data value, while data points for a 3-D graph may have three data values. Embodiments of the present disclosure can be implemented using data points with any number of dimensions.

At operation 204, the processor determines a minimum resolution (r) for each dimension. The minimum resolution dictates the minimum number of points that can be individually mapped for each dimension. For example, if the minimum resolution for the x dimension (rx) is 400, 400 different x values can be plotted on the corresponding graph. Similarly, a minimum resolution for the y dimension of 600 dictates that 600 separately mapped values can be utilized in the y dimension.

In some embodiments, a user may indicate the desired minimum resolution. In other embodiments, the minimum resolution may be automatically selected by the processor based on, for example, system capabilities (maximum rendering resolution of the video card, characteristics of the monitor). The minimum resolution may be based on, for example, the pixel count of a corresponding monitor. In other words, if a monitor has a maximum resolution of 1920×1080, the resolution may be set as 1920 in the x dimension (e.g., 1920 different x values) and 1080 in the y dimension. In some embodiments, the user may select a higher or lower resolution for the graph than for the monitor. For example, if the graph is only going to be placed on a portion of the monitor, a lower resolution may be used. However, if the user wishes to enable zooming in on the graph without data loss, the user may select a resolution higher than the pixel count.

In embodiments that include encoded aesthetics, and not just data points, the processor may also determine (e.g., receive from a user) a resolution for the aesthetics. The resolution for the aesthetics sets the maximum number of different aesthetics (e.g., colors, point sizes) that are to be encoded. For example, an aesthetics resolution of 8 allows for 8 different colors (or point sizes).

At operation 206, the processor may determine the number of valid one-byte characters (v). The number of valid one-byte characters may be based on the file format (e.g., JSON, XML, etc.) and/or character encoding (e.g., ASCII) used. For example, if the encoding is JSON, there are 93 valid one-byte characters that can be used as string values (the first 32 characters are control characters, and the quotation mark, reverse solidus, and delete characters are not valid in JSON strings). In some embodiments, fewer than the maximum number of possible one-byte values may be used. For example, in some embodiments, only 80 of the 93 valid one-byte characters may be used. The processor may also determine an algorithm to map each number in the encoding scheme to a bin value. For example, JSON permits the use of ASCII encoding, which has a character value assigned to each number. This character value to number mapping inherent to ASCII can be used as the mapping algorithm.

While embodiments of the present disclosure described herein map a data value to a single character, other embodiment may utilize two (or more) characters per data value. In these embodiments, the number of valid two-byte (or n-byte) characters may be determined.

At operation 208, the processor may partition the data frame into one or more grids. In some embodiments, operation 208 may be performed only if the value (v) is not sufficient to represent each bin in (r). As used herein, a "grid" is a portion of the resulting graph that is encoded as a single character string. The number of grids in a dimension is based on the resolution (r) in that dimension and the number of valid one-byte characters (v). The number of grids (numBins) may be calculated using the following equation:

$$numBins = int(((r-1)/v)+1).$$

where r is the resolution in that particular dimension and v is the number of valid one-byte characters. The int( ) function causes the calculated value to be rounded down to the next integer.

Following the above example using JSON, and using the full 93 valid one-byte characters, the (v) value will be set to 93. If the resolution (r) is 400, then the numBins would be int(((400−1)/93)+1) which yields five bins in this dimension.

At operation 210, the processor encodes the plurality of data points using a single character for each dimension. The processor may output a string of characters for each grid, with the characters corresponding to separate data values. For example, a two-dimensional graph with three data points and no aesthetics would be output as a string with six characters, two for each data point. The processor may automatically output the string(s) in a format supported by the file format. An example of the process of encoding the plurality of data points using a single character is shown and discussed with reference to method 300 in FIG. 3.

After encoding the plurality of data points at operation 210, the processor may transmit the encoded data to a remote computer system at operation 212. The processor may transmit the data as a distinct file (e.g., a JSON file). After transmitting the encoded data, the method 200 may end.

In some embodiments, in addition to (or instead of) encoding the data points, method 200 may be applied to aesthetic values for the scatterplot. For example, the scatterplot may have one or more aesthetic values (e.g., point sizes, colors, point shapes, etc.), and the processor may map those aesthetic values to one-byte characters.

Figure 3:
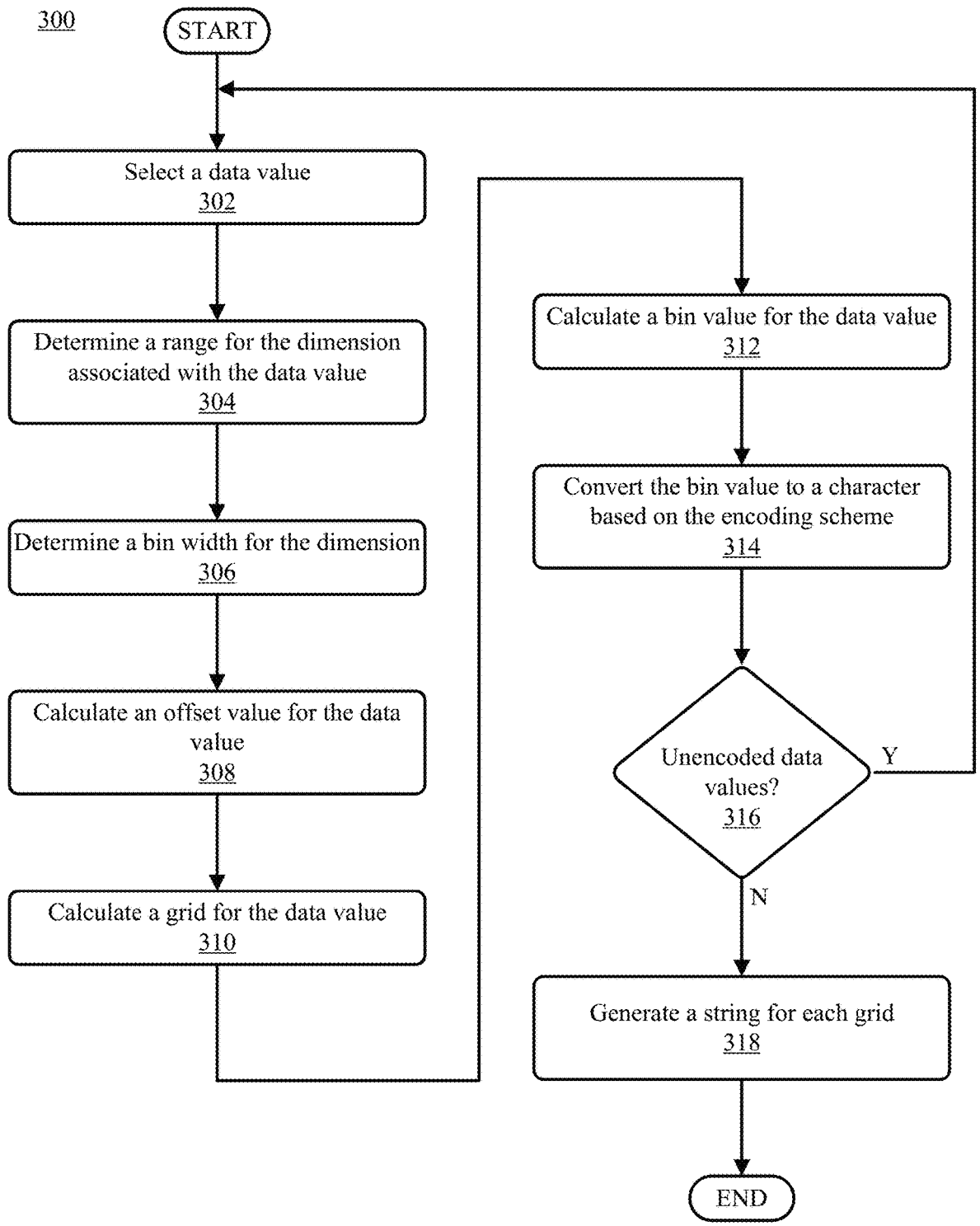
FIG. 3 illustrates a flowchart of an example method for encoding scatterplot data using a single character for each dimension, in accordance with embodiments of the present disclosure.

Referring now to FIG. 3, depicted is an example scatterplot being compressed using a method disclosed herein, in accordance with embodiments of the present disclosure. The method 300 may be performed by hardware, firmware, software executing on a processor, or any combination thereof. For example, the method 300 may be performed by processor 134 of FIG. 1. The method 300 may be performed as part of method 200. For example, in some embodiments, the method 300 describes the steps performed at operation 210. The method 300 may begin at operation 302, wherein a processor selects a data value to encode.

As described herein, a data value is a numerical value of a data point in a single dimension. For example, two-dimensional data points contain two data values, whereas three-dimensional data points contain three data values. The data value selected at operation 302 is a non-encoded data value. In other words, the selected data value is a numerical value. The data value may correspond to one of the data points obtained at operation 202.

At operation 304, the processor determines a range for the dimension associated with the data value. The range may be included in the data set that contains the data points (e.g., as a separate variable), or it may be determined by analyzing the data points in each dimension. The range for a given dimension may be calculated using the actual lowest and highest data values on that axis, rather than a "nice" value that may be displayed on the chart. For example, if the x-axis has a range of 0-100, and the x data values range from 3.12-89.7, the values [3.12, 89.7] may be sent for the X-axis. The range would therefore be equal to the maximum value in the data set minus the minimum value in the data set. Using the above example, the range would be 89.7-3.12, or 86.58.

At operation 304, the processor determines a bin width for the dimension. The bin width describes the size of each grid in accordance with the range. The bin width may be calculated using the following formula:

$$binWidth = range/numBins$$

Following the above example, which has a range of 86.58 and a numBins (i.e., number of grids in this dimension) of 5, the binWidth=86.58/5=17.316.

Next, the processor may calculate an offset value for the data value at operation 308. The offset value describes how far the data value (val) is from the minimum value (min) in that dimension. The offset value may be calculated using the following equation:

$$offset = val - min$$

Following the above example, assume that the processor is encoding a data value of 80. The processor would calculate the offset as =80−3.12=76.88.

After calculating the offset at operation 308, the processor may determine which grid the data value belongs to at operation 310. As discussed herein, the scatterplot graph may be broken into a number of grids when the resolution is greater than the number of valid characters in the encoding scheme. The processor may calculate the grid that a data value belongs to using the following equation:

$$grid = int(offset/binWidth)$$

Again, using the above example, the data value of 80 would be in the 5th grid (i.e., grid 4). This may be calculated as grid=int(76.88/17.316)=int(4.44)=4.

After calculating the grid number for the data value at operation 310, the processor may calculate a bin value for the data value at operation 312. The bin value indicates which bin within the grid the data value corresponds to. For example, each grid may have a width (e.g., size in that dimension) approximately equal to the number of valid one-byte characters, and the bin value may indicate which value of those one-byte characters the data value corresponds to. The bin value may be calculated in two steps; first, the processor may calculate the gridOffset using the following equation:

$$gridOffset = offset \% binWidth$$

where % indicates the mod is being taken.

Next, the processor may calculate the bin value (bin) using the following equation:

$$bin = int(gridOffset/binWidth*v)$$

Continuing the above example, the data value of 80 will have a gridOffset of 7.616 (i.e., 76.88% 17.316) and a bin value of 40 (i.e., int(7.616/17.316*93)).

At operation 314, the processor may convert the bin value to a character based on the encoding scheme. Encoding schemes are used to store text data as a number. Accordingly, the processor will map the number (i.e., the bin value) to its corresponding character. In some embodiments, additional offsets will be added to the bin value before converting it to a character. These may be added based on the acceptable characters to include in a string based on the character encoding used and the file format used. For example, in JSON, the first 32 values correspond to control characters, which cannot be used in a string. Additionally, other characters, such as the double quote character (34) and the reverse solidus character (92) are not permitted to be used (e.g., are invalid characters), and a corresponding offset may be applied for those characters (e.g., to skip them) as necessary. The corresponding offset may only be applied to data points that are at or above the bin value of the invalid characters.

Continuing the above example, the processor will add 32 to the bin value of 40 to account for the control characters. This results in a normalized value of 72. Because 72 is greater than 34 (which is the unusable double quote character), and additional offset of 1 is added, resulting in a normalized value of 73. Because the next offset is applied for the reverse solidus character at a value of 92, and 73<92, no additional offsets are necessary. The processor would then convert the final normalized value (73) to a corresponding character. For JSON, which uses ASCII, the value of 73 corresponds to the letter I, which the processor assigns as the character for this data value.

After converting the bin value to a character at operation 314, the processor checks if there are any unencoded data values left at decision block 316. If there are unencoded data values, the processor returns to operation 302 and selects the next data value. If no remaining data values are left to be encoded, the method 300 proceeds to operation 318, where the processor generates a string for each grid. An example string that may be generated is discussed with reference to FIG. 4. After generating a string for each grid at operation 318, the processor may generate a JSON (or other) file with the strings, and the method 300 ends.

For this algorithm, the grid counting starts in the bottom-left, going left-to-right, and bottom-to-top. Each point in the graph can now be represented with two characters, plus a few overhead characters. However, in some embodiments, the grid counting may start elsewhere, and/or it may move in a different direction. Furthermore, the method 300 may be performed in any suitable fashion. For example, instead of encoding data values one at a time, multiple data values may be simultaneously (or near simultaneously) encoded on a data point by data point basis, a dimension by dimension basis, or in any other suitable fashion.

Figure 4:
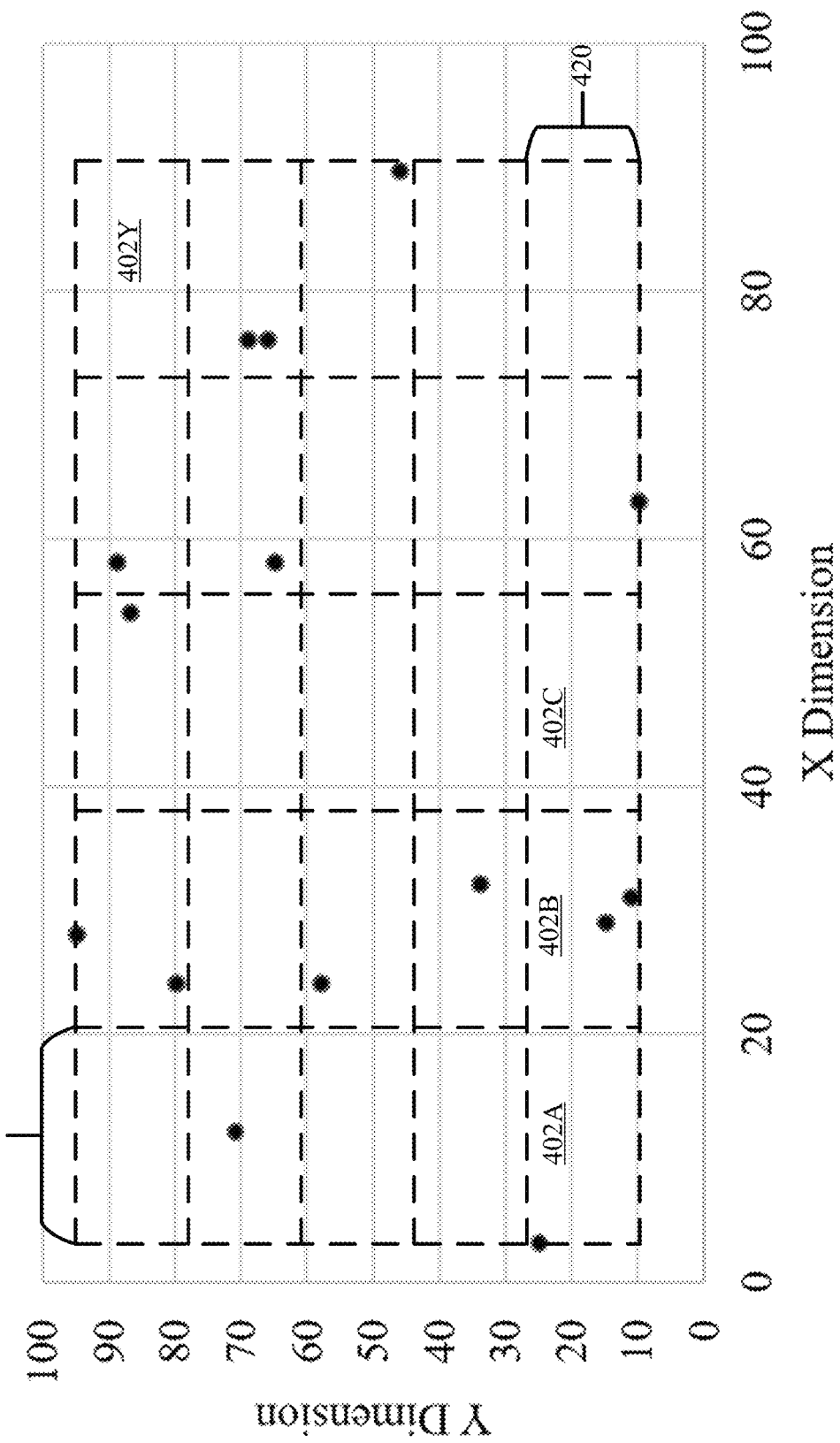
FIG. 4 depicts an example scatterplot being compressed using a method disclosed herein, in accordance with embodiments of the present disclosure.

Referring now to FIG. 4, depicted is an example scatterplot 400 that may be compressed/encoded using a method disclosed herein, in accordance with embodiments of the present disclosure. The scatterplot 400 in FIG. 4 include 15 data points, as found in Table 1 below:

TABLE 1

X and Y values for FIG. 4

| X | Y |
|---|---|
| 54 | 87 |
| 31 | 11 |
| 58 | 89 |
| 76 | 66 |
| 32 | 34 |
| 29 | 15 |
| 12 | 71 |
| 58 | 65 |
| 76 | 69 |
| 24 | 58 |
| 89.7 | 46 |
| 24 | 80 |
| 28 | 95 |
| 63 | 10 |
| 3.12 | 25 |

Processing these data points with a resolution in the x and y dimensions of 400 and using the JSON file format (with a maximum of 93 characters) results in five grids in each dimension, for a total of twenty-five grids (collectively referred to as grids 402). For example, the first grid 402A is in the bottom-left corner and has a single data point in it. The second grid 402B is to the right of the first grid and includes two data points, the third grid 402C is to the right of that, and so on through the twenty fifth grid 402Y.

The grids 402 have a width (i.e., a binWidth) in both the x dimension and the y dimension. The x-dimension width 410 is equal to the range in the x dimension (89.7−3.12=86.58) divided by the number of bins in the x dimension (5), for a width of 17.316. Similarly, the y-dimension width 420 is equal to the range in the y dimension (95−10) divided by the number of bins in the y dimension (5), for a width of 17.

By applying the method 200 and 300, the characters for the X and Y data values are calculated as shown in Table 2:

TABLE 2

Mapping Table

| X | Y | Xgrid | Ygrid | Xbin | Ybin | Xcharacter | Ycharacter |
|---|---|---|---|---|---|---|---|
| 54 | 87 | 2 | 4 | 88 | 48 | z | Q |
| 31 | 11 | 1 | 0 | 56 | 5 | Y | % |
| 58 | 89 | 3 | 4 | 15 | 59 | 0 | ] |
| 76 | 66 | 4 | 3 | 19 | 26 | 4 | ; |
| 32 | 34 | 1 | 1 | 62 | 37 | ' | F |
| 29 | 15 | 1 | 0 | 45 | 26 | N | ; |
| 12 | 71 | 0 | 3 | 47 | 53 | P | V |
| 58 | 65 | 3 | 3 | 15 | 21 | 0 | 6 |
| 76 | 69 | 4 | 3 | 19 | 42 | 4 | K |
| 24 | 58 | 1 | 2 | 19 | 75 | 4 | m |
| 89.7 | 46 | 5 | 2 | 0 | 10 | ! | + |
| 24 | 80 | 1 | 4 | 19 | 10 | 4 | + |
| 28 | 95 | 1 | 5 | 40 | 0 | I | ! |
| 63 | 10 | 3 | 0 | 42 | 0 | K | ! |
| 3.12 | 25 | 0 | 0 | 0 | 80 | ! | r |

This can be converted into a JSON file with the following data:

```
{
"range": {
"x": {
"min": 3.12,
"max": 89.7,
"bins": 400
},
"y": {
"min": 10,
"max": 95,
"bins": 400
}
},
"points": [
"!r",
"Y%N;",
...,
],
...
}
```

This JSON shows that the X data range is from 3.12 to 89.7 and has a resolution of 400, and the Y data range is from 10 to 95, and also has a resolution of 400. Furthermore, the example JSON only shows the data for the bottom-left bin and the one to the right of it. In the bottom-left corner (e.g., the first grid with grid coordinates of 0,0), there is one data point, represented by the string "!r." The next grid (grid coordinates 1,0) has two points, represented by the string "Y%N;". This would continue for all twenty-five grids.

If an aesthetic was needed (e.g., color), a separate array of color values could be added alongside of the points, like this:

```
"colors": [
  "abc",
  "afgce",
  ...,
  ...
],
```

While it unlikely that more than 15 or 20 colors would be used in a given scatterplot, all 93 characters could be used to map to 93 different colors if desired. For example, if a user is using color to represent a count, there may be 200 distinct counts, but having 200 different colors on the chart would not add much value, so the chart creator may decide to have only 20 distinct colors. In this case, counts of 1-10 would be represented by one character/color, while counts of 11-20 another, etc.

During the compression of these points, it is likely that some points will be compressed down to the same bin value. These duplicate points will either need to be thrown away or passed in as a count aesthetic using the aesthetic algorithm mentioned above.

In some embodiments, a processor displaying the encoded data may first "decode" the data by essentially performing the methods described herein in reverse. The processor may parse the file (e.g., the JSON file) to determine the total number of valid characters (v), the number of bins (i.e., the resolution r), and the range (e.g., using the min and max values). The processor may then calculate the bin width using the following equation:

$$binWidth = range/(r-1)/v + 1$$

This may be performed for each dimension. After calculating the bin width, the processor may decode the values for each dimension. First, the processor may convert the character value into its associated number (e.g., for ASCII, "I" would be 73). The processor may then reverse any offsets based on the encoding scheme. For example, in ASCII, the processor may subtract 34 from the associated number if the number is greater than 92, 33 if the number is greater than 34, but less or equal to 92, or 32 if the number is less than or equal to 32. The processor can then determine the data value per the following equation:

$$data\ value = (number/v)*binWidth + grid*binWidth + min$$

The data values for each data point and in each dimension can be calculated using the above formula. The processor may then generate a scatterplot with the data points. The following is example pseudocode for decoding a JSON file with encoded scatterplot data:

```
TOTAL_USED_CHAR_COUNT = 93
    x_min = get("x").get("min");
    x_range = get("x").get("max") - x_min;
    x_bins = Math.Ceiling(get("bins")/TOTAL_USED_CHAR_COUNT) *
TOTAL_USED_CHAR_COUNT;
    xInterval_per_bin = x_range/( (x_bins-1)/TOTAL_USED_CHAR_COUNT + 1);
    y_min = get("y").get("min");
    y_range = get("y").get("max") - get("y").get("min");
    y_bins = Math.Ceiling(get("bins")/TOTAL_USED_CHAR_COUNT) *
TOTAL_USED_CHAR_COUNT;
    yInterval_per_bin = y_range/( (y_bins-1)/TOTAL_USED_CHAR_COUNT + 1);
    decoded_X_Value_array;
    decoded_Y_Value_array;
    for( each_inner_array in point_array)
    {
        for(String valStr : each_inner_array)
        {
            //calculate the decoded X value
            charAsciiValue_x = if( valStr.char(index) > 92) valStr.char(index)-34;
                else if( valStr.char(index) > 34) valStr.char(index)-33;
                else valStr.char(index)-32;
            decoded_x_value = (charAsciiValue_x/TOTAL_USED_CHAR_COUNT) *
xInterval_per_bin + (point_array_Index-1)*xInterval_per bin + x_min;
            decoded_X_Value_array.add(decoded_x_value);
            //calculate the decoded Y value
            charAsciiValue_y = if( valStr.char(index+1) > 92) valStr.char(index+1)-34;
                else if( valStr.char(index+1) > 34) valStr.char(index+1)-33;
                else valStr.char(index+1)-32;
            decoded_y value = (charAsciiValue_y/TOTAL_USED_CHAR_COUNT) *
yInterval_per_bin + (point_array_Index -1)*yInterval_per bin + y_min;
            decoded_Y_Value_array.add(decoded_y_value);
        }
    }
```

Figure 5A:
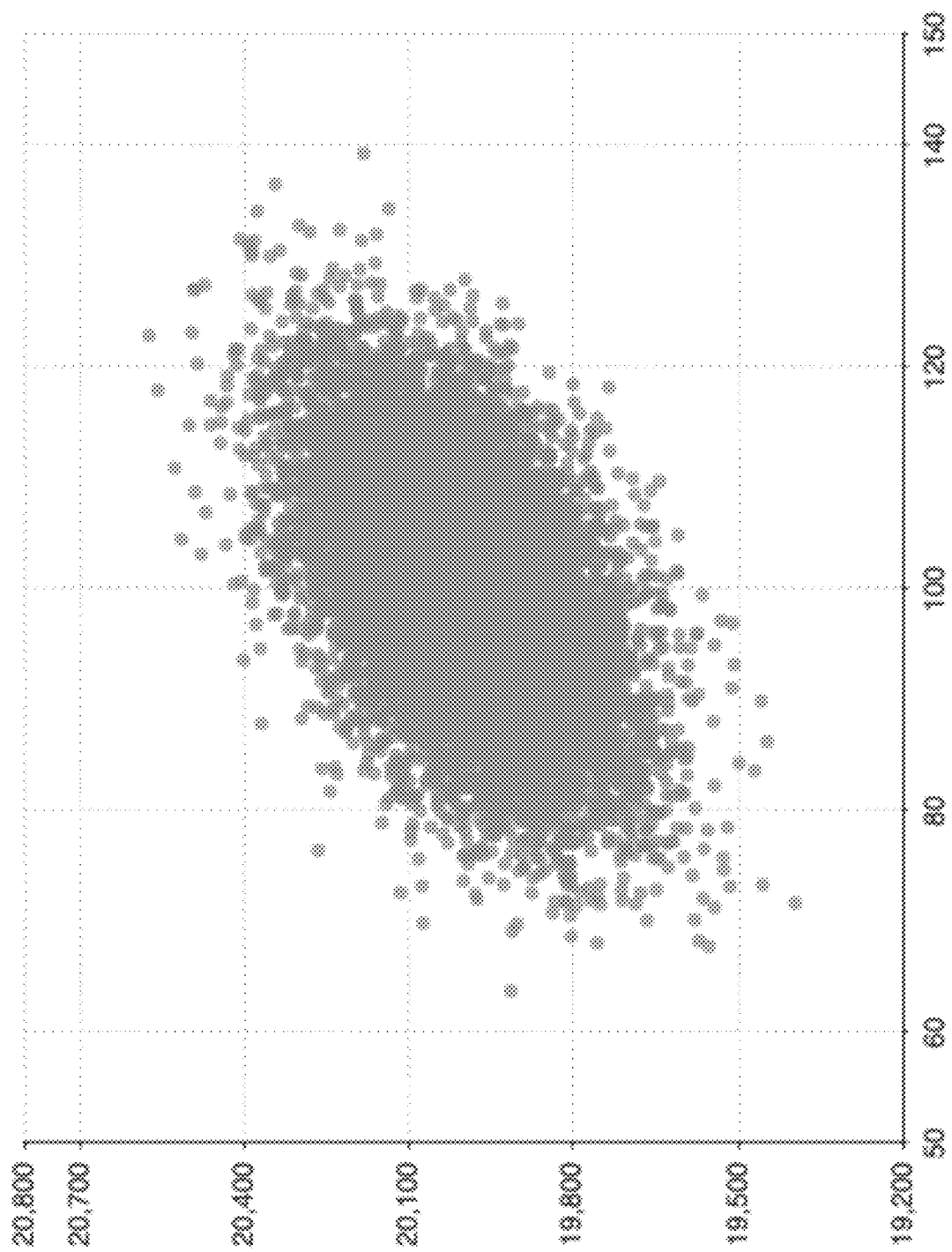
FIG. 5A illustrates an example scatterplot generated using 10,000 data points, in accordance with embodiments of the present disclosure.
Figure 5B:
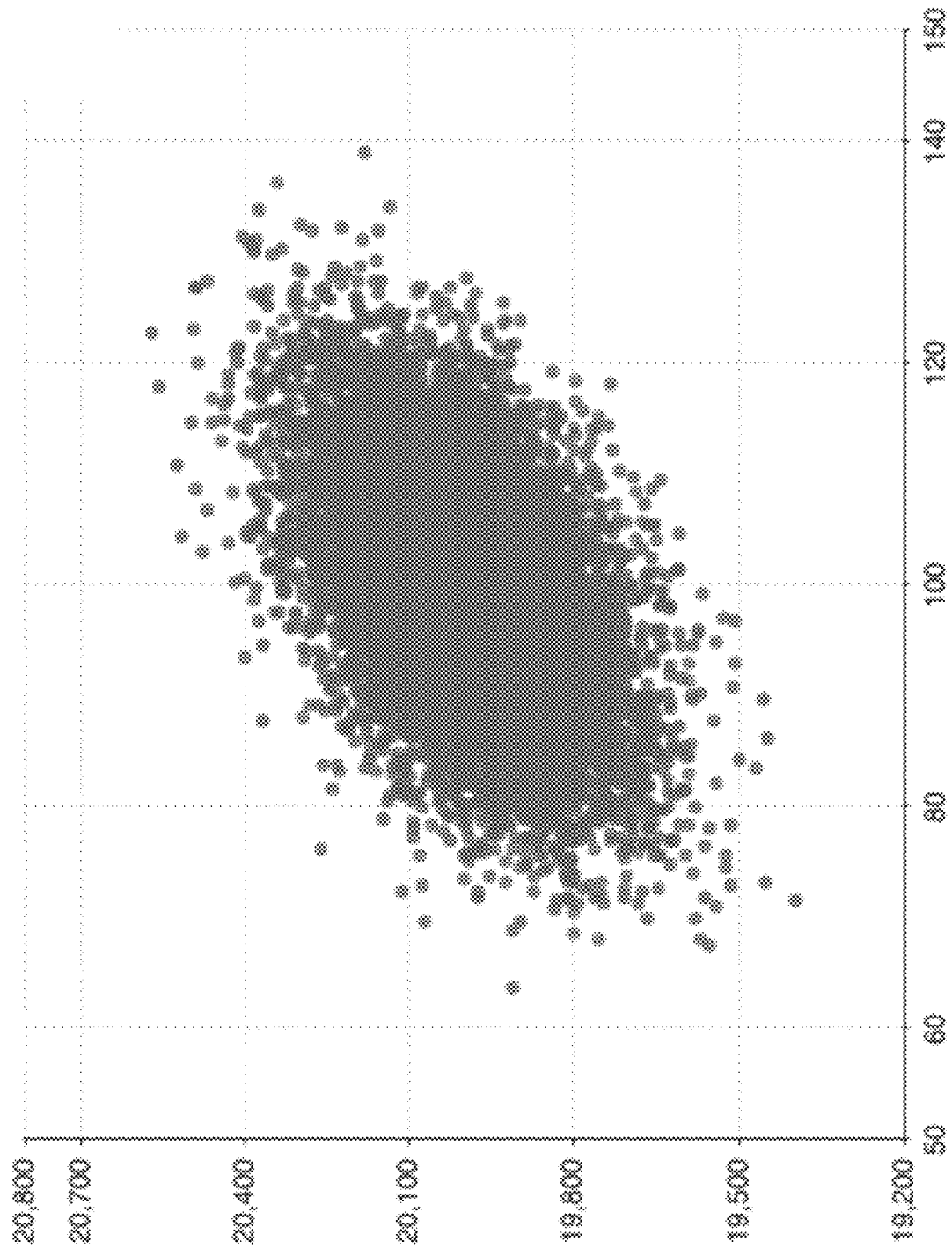
FIG. 5B illustrates an example scatterplot generated by plotting a compressed version of the 10,000 data points of FIG. 5A, in accordance with embodiments of the present disclosure.

Referring now to FIGS. 5A and 5B, FIG. 5A illustrates an example scatterplot generated using 10,000 data points, and FIG. 5B illustrates an example scatterplot generated by plotting a compressed version of the 10,000 data points of FIG. 5A, in accordance with embodiments of the present disclosure. As can be seen by comparing FIG. 5A to FIG. 5B, the data is represented in identical fashion. However, testing shows that a 10,000 point scatterplot specified with points that look like [81.0532824357768, 19681.6491255391] (as is the case in FIG. 5A) require about 350,000 bytes in the conventional form to represent. Using embodiments of the present disclosure to generate FIG. 5B, the following sizes of the JSON file can be achieved for the resolutions shown:

200×200: 20,576 bytes
400×400: 20,952 bytes
800×800: 22,184 bytes
1600×1600: 27,298 bytes
3200×3200: 45,794 bytes
6400×6400: 117,543 bytes A typical chart with a data frame of size 400×400 with no zooming enabled requires less than 6% of the original data size. Enabling zooming in 16 times still require only 33% of the original data size.

There are a number of existing compression algorithms available. Embodiments of the present disclosure are specific to creating valid JSON or XML (or similar file), so binary compression methods do not work. Furthermore, many of the existing JSON and XML compression methods involve compressing the keys or element names. These provide little or no help for the scenario discussed in this disclosure, as the data we are looking at has very few keys. It consists mainly of arrays of numbers. Here are a couple of examples:

Some embodiments described herein are most efficient when compressing data sets that have numbers with lots of digits in them, either numbers with lots of decimal places and/or numbers with lots of digits to the left of the decimal place. These types of numbers are common in the results from statistical procedures. In the example disclosed herein, the inventors tested the methods using ten decimal places. The table below shows the compression ratio for the 10,000 rows of X,Y pairs, represented in JSON form. Note that in the testing performed, duplicate points were not discarded, so it is likely the compression is even greater than what is shown in this table.

TABLE 3

Compression Methods Results

| Compression Type | Size | Percent of Original |
| --- | --- | --- |
| Pretty Print JSON | 617,705 | 100% |
| Method in disclosure (400 × 400) | 20,952 | 3.4% |
| Base64 Encoded | 476,932 | 77.2% |
| Minified JSON | 357,698 | 57.9% |
| Minified, then binary zipped, then Base64 encoded | 217,996 | 35.5% |
| Binary zipped* | 179,341 | 29.0% |
| BSON: Binary JSON | 913,536 | 148% |

The inclusion of the binary zipped compression is for reference only, and it does not generate valid JSON. As can be seen from the above table, embodiments of the present disclosure realize significant savings in the amount of storage needed to save large datasets of scatterplot data, even when compared with other compression methods. Furthermore, this reduces the bandwidth used to send data from one computer to another, and it can reduce the time required to process the data.

Figure 6:
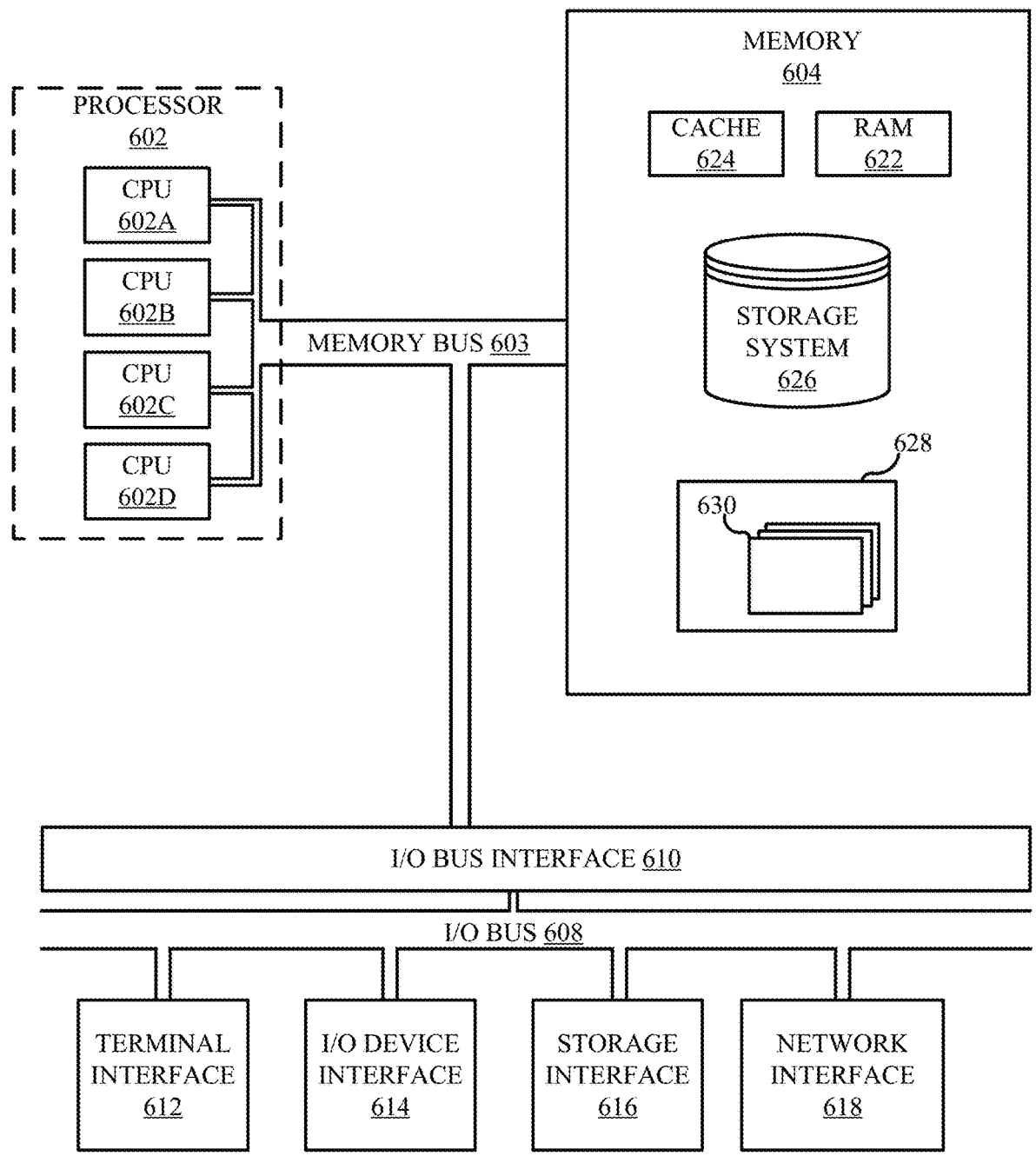
FIG. 6 illustrates a high-level block diagram of an example computer system that may be used in implementing one or more of the methods, tools, and modules, and any related functions, described herein, in accordance with embodiments of the present disclosure.

Referring now to FIG. 6, shown is a high-level block diagram of an example computer system 601 that may be used in implementing one or more of the methods, tools, and modules, and any related functions, described herein (e.g., using one or more processor circuits or computer processors of the computer), in accordance with embodiments of the present disclosure. In some embodiments, the major components of the computer system 601 may comprise one or more CPUs 602, a memory subsystem 604, a terminal interface 612, a storage interface 616, an I/O (Input/Output) device interface 614, and a network interface 618, all of which may be communicatively coupled, directly or indirectly, for inter-component communication via a memory bus 603, an I/O bus 608, and an I/O bus interface unit 610.

The computer system 601 may contain one or more general-purpose programmable central processing units (CPUs) 602A, 602B, 602C, and 602D, herein generically referred to as the CPU 602. In some embodiments, the computer system 601 may contain multiple processors typical of a relatively large system; however, in other embodiments the computer system 601 may alternatively be a single CPU system. Each CPU 602 may execute instructions stored in the memory subsystem 604 and may include one or more levels of on-board cache.

System memory 604 may include computer system readable media in the form of volatile memory, such as random access memory (RAM) 622 or cache memory 624. Computer system 601 may further include other removable/non-removable, volatile/non-volatile computer system storage media. By way of example only, storage system 626 can be provided for reading from and writing to a non-removable, non-volatile magnetic media, such as a "hard drive." Although not shown, a magnetic disk drive for reading from and writing to a removable, non-volatile magnetic disk (e.g., a "floppy disk"), or an optical disk drive for reading from or writing to a removable, non-volatile optical disc such as a CD-ROM, DVD-ROM or other optical media can be provided. In addition, memory 604 can include flash memory, e.g., a flash memory stick drive or a flash drive. Memory devices can be connected to memory bus 603 by one or more data media interfaces. The memory 604 may include at least one program product having a set (e.g., at least one) of program modules that are configured to carry out the functions of various embodiments.

One or more programs/utilities 628, each having at least one set of program modules 630 may be stored in memory 604. The programs/utilities 628 may include a hypervisor (also referred to as a virtual machine monitor), one or more operating systems, one or more application programs, other program modules, and program data. Each of the operating systems, one or more application programs, other program modules, and program data or some combination thereof, may include an implementation of a networking environment. Program modules 630 generally perform the functions or methodologies of various embodiments.

Although the memory bus 603 is shown in FIG. 6 as a single bus structure providing a direct communication path among the CPUs 602, the memory subsystem 604, and the I/O bus interface 610, the memory bus 603 may, in some embodiments, include multiple different buses or communication paths, which may be arranged in any of various forms, such as point-to-point links in hierarchical, star or web configurations, multiple hierarchical buses, parallel and redundant paths, or any other appropriate type of configuration. Furthermore, while the I/O bus interface 610 and the I/O bus 608 are shown as single respective units, the computer system 601 may, in some embodiments, contain multiple I/O bus interface units 610, multiple I/O buses 608, or both. Further, while multiple I/O interface units are shown, which separate the I/O bus 608 from various communications paths running to the various I/O devices, in other embodiments some or all of the I/O devices may be connected directly to one or more system I/O buses.

In some embodiments, the computer system 601 may be a multi-user mainframe computer system, a single-user system, or a server computer or similar device that has little or no direct user interface, but receives requests from other computer systems (clients). Further, in some embodiments, the computer system 601 may be implemented as a desktop computer, portable computer, laptop or notebook computer, tablet computer, pocket computer, telephone, smart phone, network switches or routers, or any other appropriate type of electronic device.

It is noted that FIG. 6 is intended to depict the representative major components of an exemplary computer system 601. In some embodiments, however, individual components may have greater or lesser complexity than as represented in FIG. 6, components other than or in addition to those shown in FIG. 6 may be present, and the number, type, and configuration of such components may vary. Furthermore, the modules are listed and described illustratively according to an embodiment and are not meant to indicate necessity of a particular module or exclusivity of other potential modules (or functions/purposes as applied to a specific module).

It is understood in advance that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Figure 7:
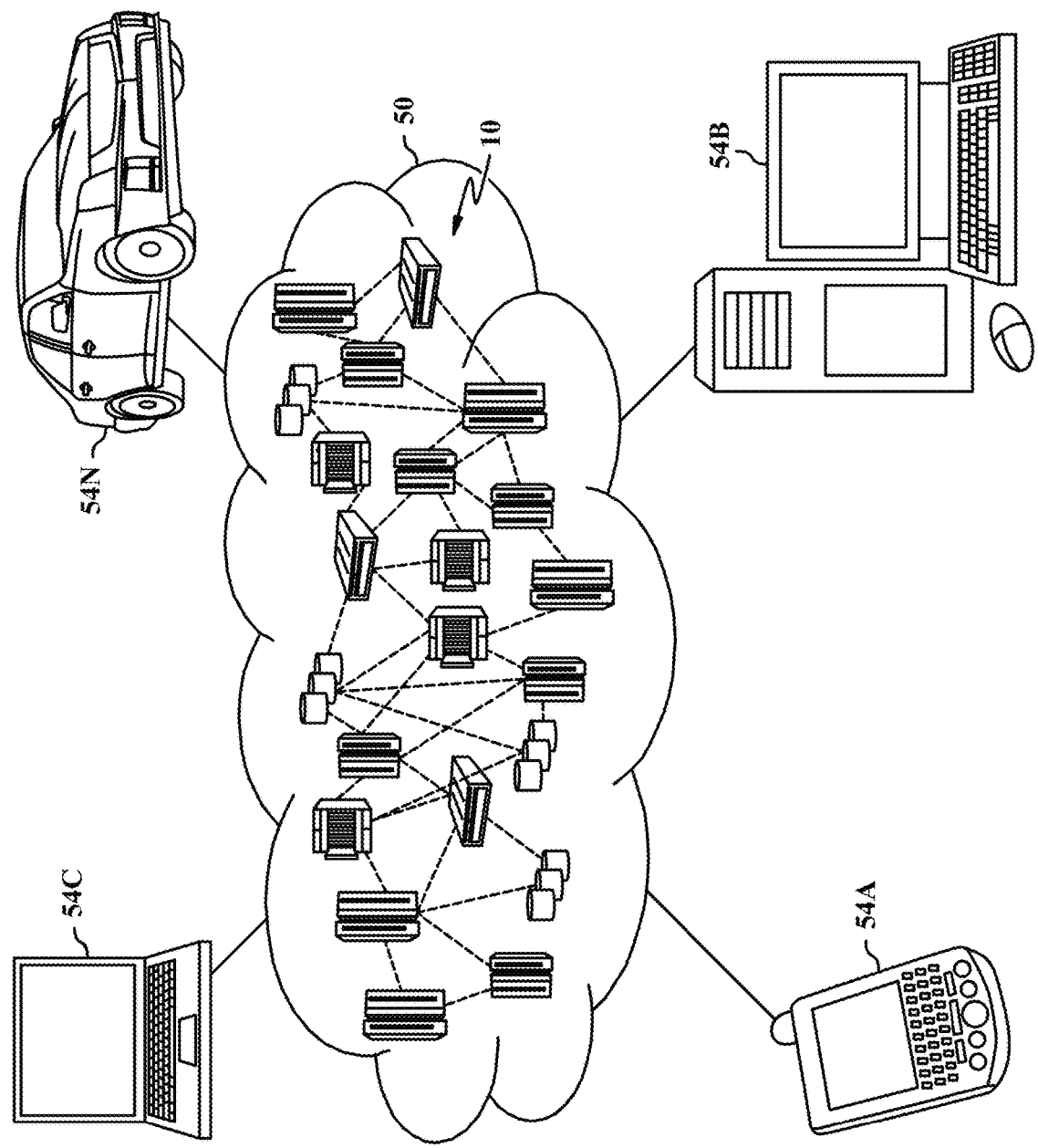
FIG. 7 depicts a cloud computing environment, in accordance with embodiments of the present disclosure.

Referring now to FIG. 7, illustrative cloud computing environment 50 is depicted. As shown, cloud computing environment 50 comprises one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 7 are intended to be illustrative only and that computing nodes 10 and cloud computing environment 50 can communicate with any type of computerized device over any type of network and/or network addressable connection (e.g., using a web browser).

Figure 8:
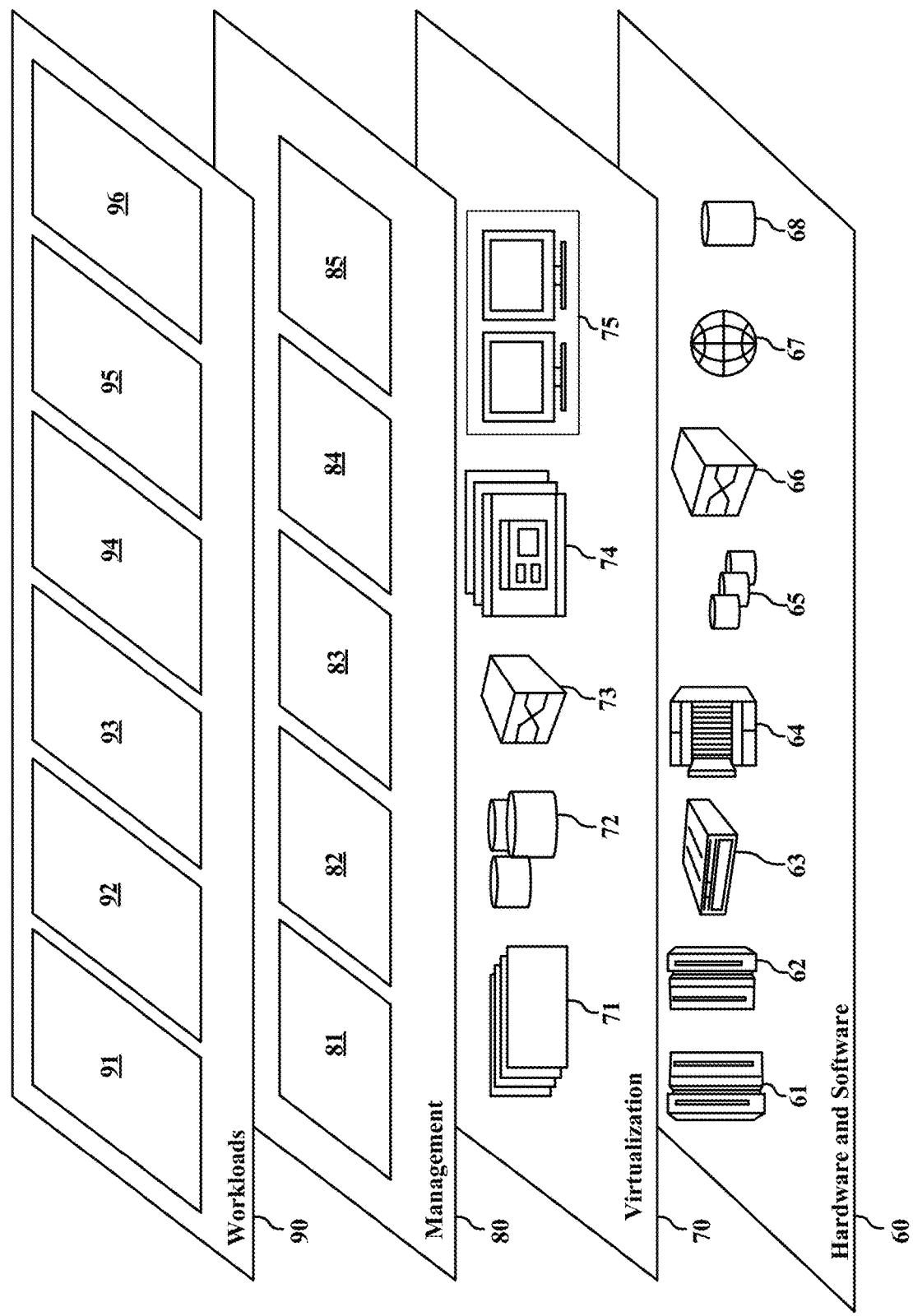
FIG. 8 depicts abstraction model layers, in accordance with embodiments of the present disclosure.

Referring now to FIG. 8, a set of functional abstraction layers provided by cloud computing environment 50 (FIG. 7) is shown. It should be understood in advance that the components, layers, and functions shown in FIG. 8 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and mobile desktops 96.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers, and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the various embodiments. As used herein, the singular forms "a," "an," and "the" are intended to include the plural forms as well, unless the context clearly indicates otherwise. It will be further understood that the terms "includes" and/or "including," when used in this specification, specify the presence of the stated features, integers, steps, operations, elements, and/or components, but do not preclude the presence or addition of one or more other features, integers, steps, operations, elements, components, and/or groups thereof. In the previous detailed description of example embodiments of the various embodiments, reference was made to the accompanying drawings (where like numbers represent like elements), which form a part hereof, and in which is shown by way of illustration specific example embodiments in which the various embodiments may be practiced. These embodiments were described in sufficient detail to enable those skilled in the art to practice the embodiments, but other embodiments may be used and logical, mechanical, electrical, and other changes may be made without departing from the scope of the various embodiments. In the previous description, numerous specific details were set forth to provide a thorough understanding the various embodiments. But, the various embodiments may be practiced without these specific details. In other instances, well-known circuits, structures, and techniques have not been shown in detail in order not to obscure embodiments.

As used herein, "a number of" when used with reference to items, means one or more items. For example, "a number of different types of networks" is one or more different types of networks.

When different reference numbers comprise a common number followed by differing letters (e.g., 100a, 100b, 100c) or punctuation followed by differing numbers (e.g., 100-1, 100-2, or 100.1, 100.2), use of the reference character only without the letter or following numbers (e.g., 100) may refer to the group of elements as a whole, any subset of the group, or an example specimen of the group.

Further, the phrase "at least one of," when used with a list of items, means different combinations of one or more of the listed items can be used, and only one of each item in the list may be needed. In other words, "at least one of" means any combination of items and number of items may be used from the list, but not all of the items in the list are required. The item can be a particular object, a thing, or a category.

For example, without limitation, "at least one of item A, item B, or item C" may include item A, item A and item B, or item B. This example also may include item A, item B, and item C or item B and item C. Of course, any combinations of these items can be present. In some illustrative examples, "at least one of" can be, for example, without limitation, two of item A; one of item B; and ten of item C; four of item B and seven of item C; or other suitable combinations.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the foregoing, reference is made to various embodiments. It should be understood, however, that this disclosure is not limited to the specifically described embodiments. Instead, any combination of the described features and elements, whether related to different embodiments or not, is contemplated to implement and practice this disclosure. Many modifications, alterations, and variations may be apparent to those of ordinary skill in the art without departing from the scope and spirit of the described embodiments. Furthermore, although embodiments of this disclosure may achieve advantages over other possible solutions or over the prior art, whether or not a particular advantage is achieved by a given embodiment is not limiting of this disclosure. Thus, the described aspects, features, embodiments, and advantages are merely illustrative and are not considered elements or limitations of the appended claims except where explicitly recited in a claim(s). Additionally, it is intended that the following claim(s) be interpreted as covering all such alterations and modifications as fall within the true spirit and scope of the invention.

What is claimed is:

1. A method comprising:
   receiving a plurality of data points in a data set, each data points having at least a first data value corresponding to a first dimension and a second data value corresponding to a second dimension;
   determining a first resolution for the first dimension and a second resolution for the second dimension, wherein the first resolution corresponds to a number of bins for the first dimension and the second resolution corresponds to a number of bins for the second dimension;

determining an encoding scheme for encoding the plurality of data points, wherein the encoding scheme includes a plurality of valid encoding characters; and encoding each of the plurality of data points based on the first resolution, the second resolution, and the encoding scheme, wherein the encoding comprises:

calculating a set of bin values for each data point, wherein the number of bin values in the set of bin values corresponds to the number of dimensions in the data point; and converting each bin value to a one-byte character of the plurality of valid characters using the encoding scheme by determining one or more offsets based on the encoding scheme and applying the one or more offsets to the bin values, wherein the one or more offsets are used to skip invalid characters in the encoding scheme.

2. The method of claim 1, wherein the first resolution is a minimum number of bins in the first dimension and the second resolution is a minimum number of bins in the second dimension.

3. The method of claim 1, wherein the encoding scheme is ASCII.

4. The method of claim 1, wherein the method further comprises:

encoding one or more aesthetic options for the plurality of data points.

5. A computer program product comprising a computer readable storage medium having program instructions embodied therewith, the program instructions executable by processor to cause the processor to perform a method comprising:

receiving a plurality of data points in a data set, each data points having at least a first data value corresponding to a first dimension and a second data value corresponding to a second dimension;

determining a first resolution for the first dimension and a second resolution for the second dimension, wherein the first resolution corresponds to a number of bins for the first dimension and the second resolution corresponds to a number of bins for the second dimension;

determining an encoding scheme for encoding the plurality of data points, wherein the encoding scheme includes a plurality of valid encoding characters; and encoding each of the plurality of data points based on the first resolution, the second resolution, and the encoding scheme, wherein the encoding comprises:

calculating a set of bin values for each data point, wherein the number of bin values in the set of bin values corresponds to the number of dimensions in the data point; and converting each bin value to a one-byte character of the plurality of valid characters using the encoding scheme by determining one or more offsets based on the encoding scheme and applying the one or more offsets to the bin values, wherein the one or more offsets are used to skip invalid characters in the encoding scheme.

6. The computer program product of claim 5, wherein the method further comprises:

encoding one or more aesthetic options for the plurality of data points.

7. The computer program product of claim 5 wherein the encoding scheme is ASCII.

8. A method comprising:

receiving a plurality of data points in a data set, each data points having at least a first data value corresponding to a first dimension and a second data value corresponding to a second dimension;

determining a first resolution for the first dimension and a second resolution for the second dimension;

determining an encoding scheme for encoding the plurality of data points, wherein the encoding scheme includes a plurality of valid encoding characters; and encoding each of the plurality of data points based on the first resolution, the second resolution, and the encoding scheme, wherein the encoding comprises:

determining a range of the first dimension;

determining a bin width for the first dimension based on the range of the first dimension and the encoding scheme;

determining an offset value for the first data value based on the first data value and a minimum data value in the first dimension;

determine a grid number for the first data value based on the offset value and the bin width;

calculate a bin value for the first data value based on the offset value, the bin width, and the number of valid encoding characters; and converting the bin value to a character using the encoding scheme.

9. The method of claim 8, wherein the first resolution is a minimum number of bins in the first dimension and the second resolution is a minimum number of bins in the second dimension.

10. The method of claim 8, wherein the encoding scheme is ASCII.

11. The method of claim 8, wherein the method further comprises:

encoding one or more aesthetic options for the plurality of data points.

* * * * *